US008030979B2

(12) United States Patent
Yoo

(10) Patent No.: US 8,030,979 B2
(45) Date of Patent: Oct. 4, 2011

(54) CIRCUIT FOR GENERATING REFERENCE VOLTAGE

(75) Inventor: Min-Jong Yoo, Bucheon-si (KR)

(73) Assignee: Dongbu HiTek Co., Ltd., Seoul (KR)

( * ) Notice: Subject to any disclaimer, the term of this patent is extended or adjusted under 35 U.S.C. 154(b) by 36 days.

(21) Appl. No.: 12/639,834

(22) Filed: Dec. 16, 2009

(65) Prior Publication Data

US 2010/0164609 A1 Jul. 1, 2010

(30) Foreign Application Priority Data

Dec. 30, 2008 (KR) ........................ 10-2008-0136926

(51) Int. Cl.
*H03L 7/00* (2006.01)

(52) U.S. Cl. ........................................ 327/143; 327/549

(58) Field of Classification Search .................. 327/142, 327/143, 535, 537, 538, 539
See application file for complete search history.

(56) References Cited

U.S. PATENT DOCUMENTS

| | | | | |
|---|---|---|---|---|
| 6,784,652 | B1 * | 8/2004 | Aude | 323/316 |
| 7,531,999 | B2 * | 5/2009 | Chang | 323/317 |
| 7,589,573 | B2 * | 9/2009 | Tang et al. | 327/143 |

* cited by examiner

*Primary Examiner* — Jeffrey Zweizig
(74) *Attorney, Agent, or Firm* — Sherr & Vaughn, PLLC

(57) ABSTRACT

A reference voltage generating circuit includes a reference voltage generating unit generating a uniform reference voltage in response to a bias voltage, a bias voltage generating unit generating the bias voltage, and a start-up circuit, after activating the bias voltage generating unit by receiving a first supply voltage, canceling a change of the first supply voltage to maintain a separation from the bias voltage generating unit. The circuit adopts a start-up circuit having a voltage distributing unit, thereby preventing a quiescent point of a bias voltage generating unit from entering a zero state and prevents a reference voltage from rising in a power-up state that an analog supply voltage rises according to a change of an external design environment such as a power, a temperature, a process parameter and the like, thereby generating a reference voltage more stably. As a result, current consumption and power consumption are minimized.

17 Claims, 6 Drawing Sheets

CIRCUIT FOR GENERATING REFERENCE VOLTAGE

This application claims the benefit under 35 U.S.C. §119 to Korean Patent Application No. 10-2008-0136926 (filed on Dec. 30, 2008), which is hereby incorporated by reference in its entirety.

BACKGROUND

Generally, a bandgap reference voltage generator (hereinafter abbreviated BGR) is used for an analog circuit including a high resolution comparator, an analog to digital (A/D) converter, a digital to analog (D/A) converter and/or a data converter and also is used for c circuit for supplying a reference voltage (Vref) of a memory circuit. The BGR needs to supply a stable reference voltage (Vref) despite a change of an external design environment, e.g., a change of power, temperature, process parameter or the like.

Generally, in order to secure a stable operation characteristic against a change of an external design environment for a system circuit, a BGR for supplying a reference voltage or current constant in such an external environment change as a supply voltage is used as a bias power supply device. A related reference voltage generating circuit includes a self-bias current mirror circuit to provide a BGR with a uniform bias voltage (VBIAS). Yet, this self-bias current mirror circuit may cause an undesired problem of putting a bias voltage (VBIAS) in a zero state for example.

Therefore, a start-up circuit preventing a bias voltage from being put into a zero state in a normal operation of a self-bias current mirror circuit may be additionally included in a reference voltage generating circuit. The start-up circuit helps an initial operation of the self-bias current mirror circuit only. But, the start-up circuit should not affect an operation of the self-bias current mirror circuit in a manner of being separated from the self-bias current mirror circuit if the self-bias current mirror circuit enters a normal operation state.

However, related start-up circuits may enter a power-up state, in which a supply voltage (VDDA) of an analog type ascends, if an external design environment changes. In the power-up state, this may cause a problem that the start-up circuit may affect the self-bias current mirror circuit to raise a reference voltage generated from the BGR. Moreover, in this case, since a current flowing in the self-bias current mirror circuit increases, a current consumed by the self-bias current mirror circuit may be raised irrespective of an operation of the self-bias current mirror circuit.

SUMMARY

Embodiments relate to a voltage generating circuit, and more particularly, to a circuit for generating a reference voltage. Although suitable for a wide scope of applications, embodiments are particularly suitable for generating a uniform reference voltage constantly. Embodiments relate to a circuit for generating a reference voltage, by which a quiescent point of a BGR supplying a uniform reference voltage or current can be prevented from entering a zero state, by which a reference voltage can be prevented from rising despite that a supplied analog supply voltage VDDA rises, and by which a power consumption can be minimized.

Embodiments relate to a reference voltage generating circuit that includes a reference voltage generating unit generating a uniform reference voltage in response to a bias voltage, a bias voltage generating unit generating the bias voltage, and a start-up circuit, after activating the bias voltage generating unit by receiving a first supply voltage, canceling a change of the first supply voltage to maintain a separation from the bias voltage generating unit.

Embodiments relate to a reference voltage generating circuit that includes a reference voltage generating unit generating a uniform reference voltage in response to a bias voltage, a bias voltage generating unit generating the bias voltage, and a start-up circuit operating in response to an enable signal, the start-up circuit, after activating the bias voltage generating unit by receiving a first supply voltage, canceling a change of the first supply voltage to maintain a separation from the bias voltage generating unit.

Accordingly, embodiments adopt a start-up circuit having a voltage distributing unit, thereby preventing a quiescent point of a bias voltage generating unit from entering a zero state. Embodiments minimize a rise in a reference voltage (Vref) in a power-up state when an analog supply voltage (VDDA) rises according to a change of an external design environment such as a power, a temperature, a process parameter and the like, thereby generating a reference voltage more stably. As a result, current consumption is minimized. Also, embodiments minimize excessive power consumption in a manner that a device using a reference voltage is supplied with a reference voltage (Vref) via another source or that an operation of a start-up circuit is stopped in a power-down or standby mode of the device using the reference voltage.

DRAWINGS

DESCRIPTION

Figure 1:
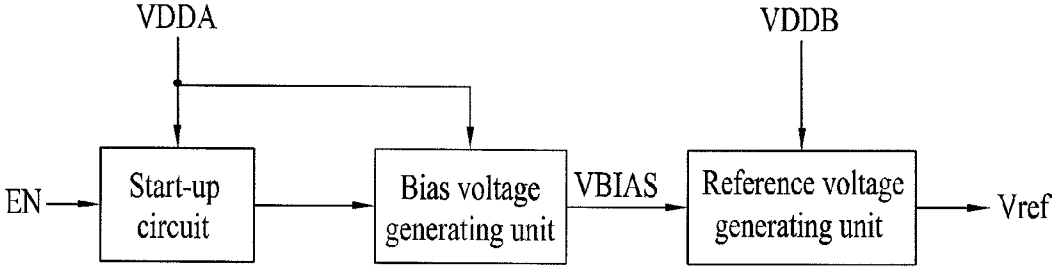
FIG. 1 is a schematic block diagram of a reference voltage generating circuit according to embodiments.

FIG. 1 is a schematic block diagram of a reference voltage generating circuit according to embodiments. This circuit includes a start-up circuit 10, a bias voltage generating unit 40 and a reference voltage generating unit 60. A first supply voltage VDDA is provided to the start-up circuit 10 and the bias voltage generating unit 40. A second supply voltage VDDB is provided to the reference voltage generating unit 60. In this case, the first supply voltage VDDA may be equal to or different from the second supply voltage VDDB. In general, in the following description, the first supply voltage VDDA is considered to be substantially equal to the second supply voltage VDDB. Also, the first supply voltage VDDA may be applied to the reference voltage generating unit 60 as well.

Figure 2:
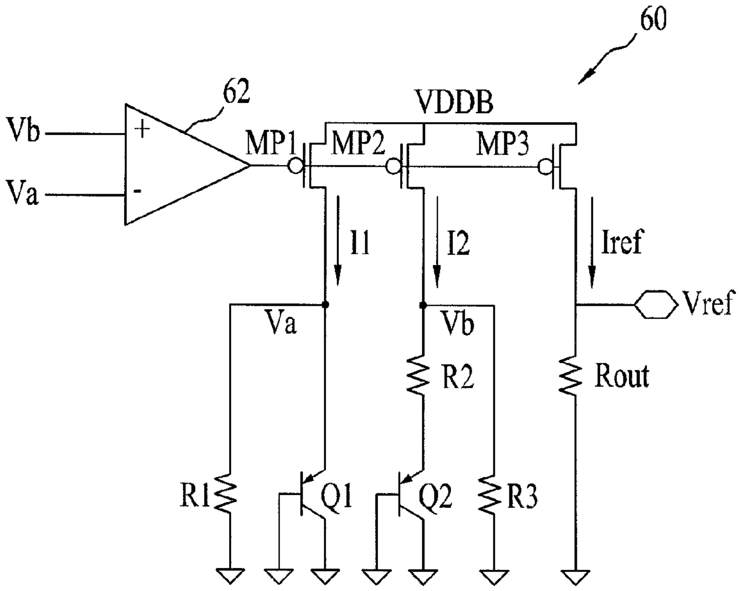
FIG. 2 is diagram of a circuit for an example of the reference voltage generating unit shown in FIG. 1.

The reference voltage generating unit 60 shown in FIG. 1 is biased in response to a bias voltage VBIAS outputted from the bias voltage generating unit 40 and then generates a uniform reference voltage Vref. FIG. 2 is diagram of a circuit for an example of the reference voltage generating unit 60 shown in FIG. 1.

Referring to FIG. 2, the reference voltage generating unit 60 may include a differential amplifier 62, first to third MOS (metal oxide semiconductor) transistors MP1 to MP3, first and second bipolar transistors Q1 and Q2, first to third resistors R1 to R2 and an output resistor Rout. In operation, the differential amplifier 62 receives inputs of first and second node voltages Va and Vb and then provides its output to gates of the first to third MOS transistors MP1 to MP3.

The first MOS transistor MP1 may include a gate connected to the output of the differential amplifier 62, a source connected to the second supply voltage VDDB and a drain connected to the first node voltage Va. The second MOS transistor MP2 may include a gate connected to the output of the differential amplifier 62, a source connected to the second supply voltage VDDB and a drain connected to the second node voltage Vb. The third MOS transistor MP3 may include a gate connected to the output of the differential amplifier 62, a source connected to the second supply voltage VDDB and a drain connected to a reference voltage Vref.

A first bipolar transistor Q1 may include an emitter and a collector connected between the first node voltage Va and a ground, which is a reference potential. The first bipolar transistor Q1 also can include a base connected to the reference potential. Thus, a first resistor R1 may be connected between the first node voltage Va and the ground that is the reference potential with a second resistor R2 having one side connected to the second node voltage Vb. In particular, the second resistor R2 may be connected between the second MOS transistor MP2 and the second bipolar transistor. A third resistor R3 may be connected between the second node voltage Vb and the reference potential. The output resistor Rout is connected between the reference voltage Vref and the reference potential. For example, the output resistor Rout may be connected between the third MOS transistor MP3 and the reference potential. In this case, the first resistor R1 can have a resistance equal to or different from that of the third resistor R3, thereby allowing for a wide range of resistance values.

The second bipolar transistor Q2 includes an emitter connected to the other side of the second resistor R2, a collector connected to the reference potential, and a base connected to the ground that is the reference potential.

Operations of the above-configured reference voltage generating unit 60 are explained as follows. First of all, the reference voltage generating unit 60 shown in FIG. 2 may be designed to supply a reference voltage Vref which is stable against a change of an external design environment such as a power, a temperature, a process parameter and the like (i.e., insensitive to an external design environment). An operational principle of the reference voltage generating unit 60 is explained as follows. First of all, a thermal voltage (VT) increasing for temperature according to a current ratio N of the second bipolar transistor Q2, i.e., a positive temperature coefficient voltage, is included in the second node voltage Vb. On the contrary, an emitter-base voltage Vbe decreasing for temperature according to a current ratio 1 of the first bipolar transistor Q1, i.e., a negative temperature coefficient voltage, is included in the first node voltage Va. By combining these voltages together, a stable reference current Iref may be generated. This can be observed from the reference current Iref expressed as Formula 1 and the reference voltage Vref expressed as Formula 2.

$$I_{ref} = \frac{V_{eb1}}{R1} + \frac{VT\ln N}{R2} \quad \text{[Formula 1]}$$

$$V_{ref} = R_{out} \times \left[\frac{V_{eb1}}{R1} + \frac{VT\ln N}{R2}\right] \quad \text{[Formula 2]}$$

In this case, $V_{eb1}$ indicates an emitter-base voltage of the first bipolar transistor Q1. And, N is a resistance ratio of the first resistor R1 to the second resistor R2 or, as mentioned in the foregoing description, a current ratio of the first bipolar transistor Q1 to the second bipolar transistor Q2.

The differential amplifier 62 receives the first and second node voltages Va and Vb and then outputs a uniform voltage less sensitive to a temperature change to the gates of the first to third MOS transistors MP1 to MP3. Hence, the third MOS transistor MP3 may generate a uniform reference current Iref less sensitive to the temperature change, as shown in Formula 1, whereby a uniform reference voltage Vref can be generated according to the resistor Rout, as shown in Formula 2.

Meanwhile, the bias voltage generating unit 40, such as the example one shown in FIG. 1, generates a bias voltage VBIAS and then outputs it to the reference voltage generating unit 60. The bias voltage VBIAS is provided to a bias unit included in the reference voltage generating unit 60. The bias unit plays a role in biasing the reference voltage generating unit 60 in response to the bias voltage VBIAS.

The start-up circuit 10, such as the example one shown in FIG. 1, receives a first supply voltage VDDA and then activates the bias voltage generating unit 40 in the early stage. Thereafter, the start-up circuit 10 in normal state is separated from the bias voltage generating unit 40 in circuit. If the first supply voltage VDDA is changed by an external environment, the separation between the start-up circuit and the bias voltage generating unit may not be maintained according to related circuits. Yet, according to embodiments described herein, the start-up circuit 40 plays a role in canceling the change of the first supply voltage VDDA in order to keep the separation from the bias voltage generating unit 40.

Also, the start-up circuit 40 may stop operating in response to an enable signal EN provided externally. In this case, the enable signal EN may be generated in the following situation and can be then provided to a start-up circuit 10A as, for example, shown in FIG. 8.

Initially, when a device relying on a reference voltage, such as a comparator, an A/D converter, a D/A converter and/or a data converter as an analog circuit, a memory circuit and the like, receives a reference voltage Vref via another source instead of the reference voltage generating unit 60 shown in FIG. 1, an enable signal EN is generated and then provided to the start-up circuit 10. Alternatively, an enable signal EN can be generated in a power-down mode enabling a power not to be supplied to the reference voltage using device for a while. Alternatively, an enable signal EN can be generated in a standby mode the reference voltage using device may temporarily enter.

Figure 3:
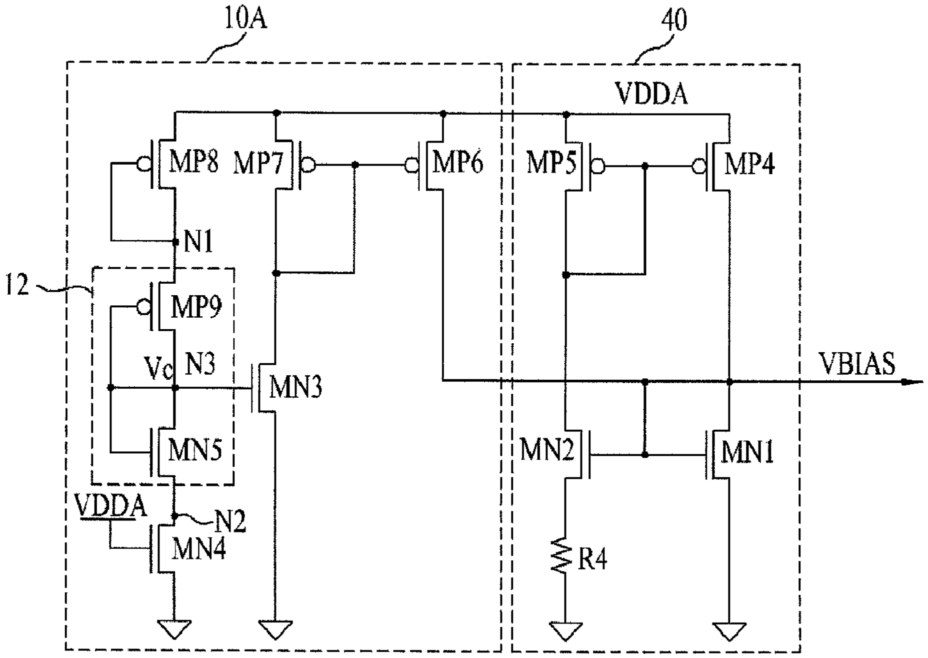
FIG. 3 is a circuit diagram of a start-up circuit and a bias voltage generating unit shown in FIG. 1 according to embodiments.

FIG. 3 is an example circuit diagram of the start-up circuit 10 and the bias voltage generating unit 40 shown in FIG. 1 according to embodiments of the present invention. Referring to FIG. 3, the bias voltage generating unit 40 may include fourth to seventh MOS transistors MP4, MP5, MN1 and MN2 and a fourth resistor R4.

The fourth transistor MP4 includes a source connected to a first supply voltage VDDA and a drain connected to a bias voltage VBIAS. The fifth MOS transistor MP5 includes a gate connected to a gate of the fourth MOS transistor MP4 and a source connected to the first supply voltage VDDA. The sixth MOS transistor MN1 includes a drain connected to the bias voltage VBIAS and a source connected to a ground that is a reference potential. The seventh MOS transistor MN2 includes a gate connected to the gate of the sixth MOS transistor MN1, a drain connected to the drain of the fifth MOS transistor MP5 and a source connected to the fourth resistor R4. And, the fourth resistor R4 is connected between the source of the seventh MOS transistor MN2 and the reference potential.

The reference voltage generating unit 60 shown in FIG. 1 is advantageous in operating sensitively according to a change of the first supply voltage VDDA. One way to minimize the reference voltage generating unit's 60 sensitivity to the first supply voltage VDDA is to use the above-configured bias voltage generating unit 40.

Also, according to embodiments, the start-up circuit 10A, as shown in FIG. 3, may include eighth to twelfth transistors MP6, MP7, MN3, MP8 and MN4 and a voltage distributing unit 12.

The eighth MOS transistor MP6 includes a source connected to the first supply voltage VDDA and a drain connected to the bias voltage BIAS. The ninth MOS transistor MN3 includes a gate connected to a gate of the eighth MOS transistor MP6 and a source connected to the first supply voltage VDDA. The tenth MOS transistor MN3 includes a drain connected to a drain of the ninth MOS transistor MP7 and a source connected to the reference potential. The eleventh MOS transistor MP8 includes a source connected to the first supply voltage VDDA and a gate and drain connected to each other. And, the twelfth MOS transistor MN4 includes a gate connected to the first supply voltage VDDA and a source connected to the reference potential.

The voltage distributing unit 12 may be connected between the drain of the eleventh MOS transistor MP8 and the drain of the twelfth MOS transistor MN4 and may supply a uniform control voltage Vc for canceling a change of the first supply voltage VDDA to prevent the change of the first supply voltage VDDA due to an external environment from affecting the tenth MOS transistor MN3.

According embodiments, the voltage distributing unit 12 can be implemented in various forms. For example, the voltage distributing unit 12, as shown in FIG. 3, can include a thirteenth MOS transistor MP9 and a fourteenth MOS transistor MN5. The thirteenth MOS transistor MP9 includes a source connected to the drain of the eleventh MOS transistor MP8 and a drain connected to the control voltage Vc. The fourteenth MOS transistor MN5 includes a drain connected to the control voltage Vc, a source connected to the drain of the twelfth MOS transistor MN4, and a gate connected to the gate and drain of the thirteenth MOS transistor MP9.

Figure 4:
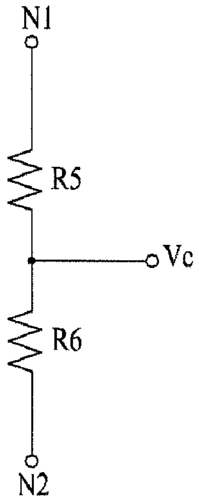
FIGS. 4 to 7 are diagrams of a voltage distributing unit shown in FIG. 4 according to embodiments.

FIGS. 4 to 7 depict variations of a voltage distributing unit 12 according to embodiments. Referring to FIG. 4, the voltage distributing unit 12 includes a resistor R5 and a resistor R6. In this case, the resistor R5 can have a resistance equal to or different from that of the resistor R6. The resistors R5 and R6 are connected in serial between the drain N1 of the eleventh MOS transistor MP8 and the drain N2 of the twelfth MOS transistor MN4. In this case, the control voltage Vc is generated from a connected portion between the resistors R5 and R6.

Figure 5:
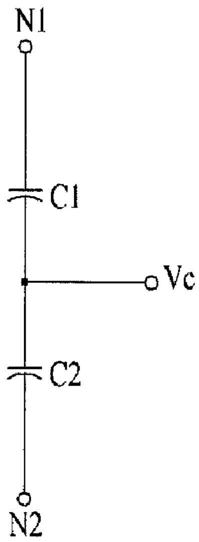

Referring to FIG. 5, the voltage distributing unit 12 includes a first capacitor C1 and a second capacitor C2. In this case, the first capacitor C1 can have a capacitance equal to or different from that of the second capacitor C2. The first and second capacitors C1 and C2 are connected in serial between the drain N1 of the eleventh MOS transistor MP8 and the drain N2 of the twelfth MOS transistor MN4. In this case, the control voltage Vc is generated from a connected portion between the first and second capacitors C1 and C2.

Figure 6:
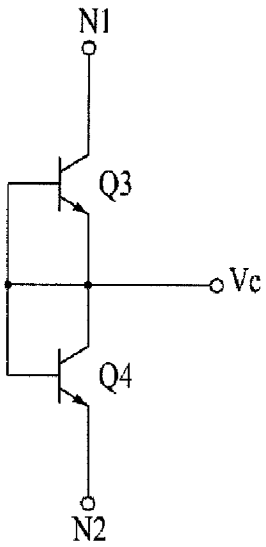

Referring to FIG. 6, the voltage distributing unit 12 can include a third bipolar transistor Q3 and a fourth bipolar transistor Q4. In this case, the third bipolar transistor Q3 includes a collector connected to the drain of the eleventh MOS transistor MP8, an emitter connected to the control voltage Vc, and a base connected to the control voltage Vc. The fourth bipolar transistor Q4 includes a collector connected to the control voltage Vc, an emitter connected to the drain N2 of the twelfth MOS transistor MN4, and a base connected to the base and emitter of the third bipolar transistor Q3.

Figure 7:
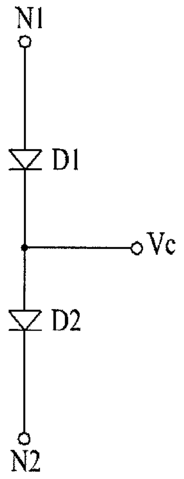

Referring to FIG. 7, the voltage distributing unit 12 can include a first diode D1 and a second diode D2. The first diode D1 includes an anode connected to the drain N1 of the eleventh MOS transistor MP8 and a cathode connected to the control voltage Vc. The second diode D2 includes an anode connected to the control voltage Vc and a cathode connected to the drain N2 of the twelfth transistor MN4.

Operations of the voltage distributing unit having one of the configurations shown in FIGS. 3 to 7 are explained as follows. First of all, as mentioned in the foregoing description, the voltage distributing units 12 shown in FIGS. 3 to 7 may be implemented in form of an inverter. When the first supply voltage VDDA is stably supplied without change, a voltage at a node N1 is named V1 and a voltage at a node N2 is named V2. According to the change of the first supply voltage VDDA, the voltage at each of the nodes N1 and N2 can vary according to Formula 3.

$$V1' = V1 + \Delta V1$$

$$V2' = V2 + \Delta V2 \qquad \text{[Formula 3]}$$

In Formula 3, V1' indicates a voltage changed at the node N1 affected by the change of the first supply voltage VDDA, V2' indicates a voltage changed at the node N2 affected by the change of the first supply voltage VDDA, ΔV1 indicates a changed quantity of V1, and ΔV2 indicates a changed quantity of V2.

If characteristics of the devices existing between the nodes N1 and N2 are substantially identical (i.e., if the characteristics of the thirteenth and fourteenth MOS transistors MP9 and MN5 are substantially identical, the resistances of the resistors R5 and R6 are substantially identical, the capacitances of the capacitors C1 and C2 are substantially identical, characteristics of the third and fourth bipolar transistors Q3 and Q4 are substantially identical, and characteristics of the first and second diodes D1 and D2 are substantially identical), then the voltage changed quantities ΔV1 and ΔV2 between the nodes N1 and N2 according to the change of the first supply voltage VDDA may be reciprocally cancelled, or substantially so. Since the voltage distributing unit 12 generates the control voltage Vc at a stable level irrespective of the change of the first supply voltage VDDA, it is able to prevent a threshold voltage of the tenth MOS transistor MN3 from increasing.

Operations of the start-up circuit 10A shown in FIG. 3 are explained as follows. The bias voltage generating unit 40 is able to enter a zero state enabling a bias voltage VBIAS not to be generated in a normal operation. Moreover, as first supply voltage VDDA of an analog type increases, a current does not flow in the fourth MOS transistor MP4 of the bias voltage generating unit 40. Therefore, a bias voltage VBIAS may be abnormally generated.

The start-up circuit 10A plays a role in solving this problem. In particular, when the bias voltage generating unit 40 is in the zero state, the tenth MOS transistor MN3 of the start-up circuit 10 is turned on and then finds a quiescent point of the bias voltage generating unit 40. Therefore, the bias voltage VBIAS can be normally generated. If the bias voltage VBIAS is normally generated, the tenth MOS transistor MN3 becomes turned off.

If the voltage distributing unit 12 shown in FIG. 3 does not exist in a power-up state in which the first supply voltage VDDA increases, a voltage difference between the source and gate of the eleventh MOS transistor MP8 increases so that the voltage at the node N3 can increase until the tenth MOS transistor MN3 is turned on. In this case, a bias voltage VBIAS smaller than a target value may be generated from the bias voltage generating unit 40 connected to the start-up circuit 10A. Since the reference voltage generating unit 60 is biased relatively small, the reference voltage Vref may increase. Moreover, since the current flowing in the eleventh MOS transistor MP8 increases in the power-up state, the current consumed by the whole reference voltage generating circuit shown in FIG. 1 may increase.

Yet, according to embodiments, since the voltage distributing unit 12 shown in FIG. 3 is provided, the voltage difference between the source and gate of the eleventh MOS transistor MP8 in the power-up state can be maintained as a uniform voltage difference (VDDA−ΔV) (in this case, ΔV indicates a changed quantity of the first supply voltage VDDA) instead of the first supply voltage VDDA. Namely, in the power-up state, a control voltage Vc maintained at a uniform level is generated from the voltage distributing unit 12. Therefore, it is able to prevent the reference voltage Vref from increasing in the power-up state. And, it is also able to prevent the current consumption from increasing. These operations of the start-up circuit 10A do not affect the reference voltage generating unit 60.

Figure 8:
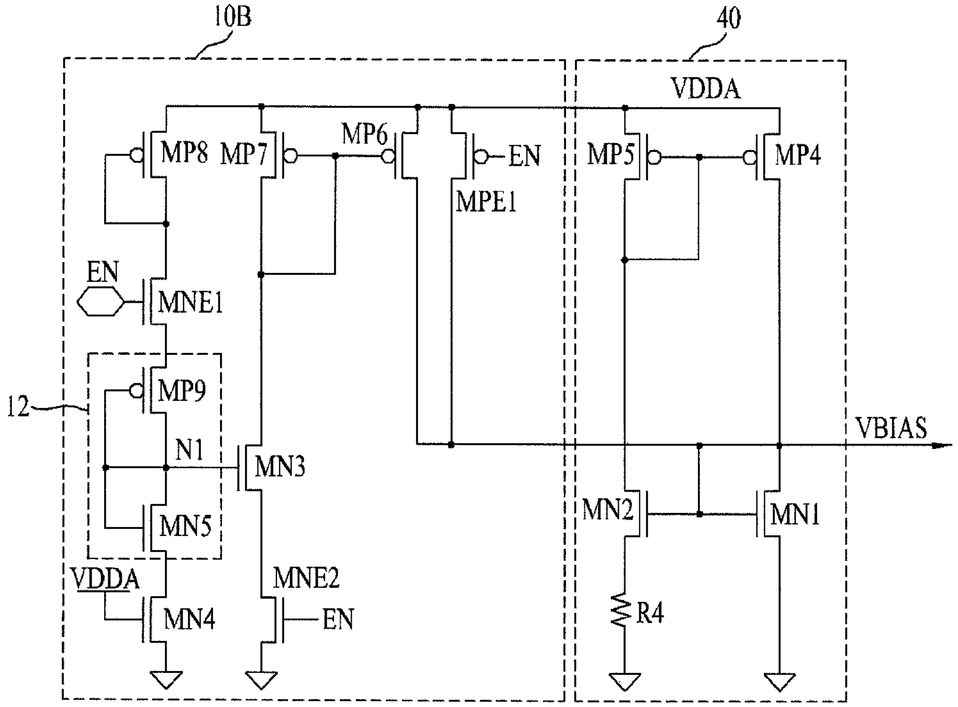
FIG. 8 is a circuit diagram of a start-up circuit according to embodiments.

FIG. 8 is a circuit diagram of another example start-up circuit 10B according to embodiments. A bias voltage generating unit 40 shown in FIG. 8 has the same configuration of the former bias voltage generating unit shown in FIG. 3, of which details are omitted from the following description. Referring to FIG. 8, a start-up circuit 10B shown in FIG. 8 differs from the start-up circuit 10A shown in FIG. 3 in further including fifteenth to seventeenth MOS transistors MPE1, MNE1 and MNE2. The configurations and operations of the fifteenth to seventeenth MOS transistors MPE1, MNE1 and MNE2 are explained in the following description.

The fifteenth MOS transistor MPE1 includes a source and drain respectively connected to the source and drain of the eighth MOS transistor MP6 and a gate connected to an enable signal EN. The sixteenth MOS transistor MNE1 includes a drain connected to the drain of the eleventh MOS transistor MP8, a source connected to the voltage distributing unit 12, and a gate connected to the enable signal EN. The seventeenth MOS transistor MNE2 includes a drain connected to the source of the tenth MOS transistor MN3, a source connected to the reference potential, and a gate connected to the enable signal EN.

Operation of the above-configured start-up circuit 10B is explained as follows. If the fifteenth to seventeenth MOS transistors MPE1, MNE1 and MNE2 do not exist, a reference voltage using device is supplied with a reference voltage Vref through another source or an excessive leakage current may be generated from the start-up circuit 10A in a power-down mode or a standby mode. To prevent this, the reference voltage Vref is provided to the reference voltage using device via another device, or an enable signal at a logic level 'low' is provided to the start-up circuit 10B shown in FIG. 8 in the power-down or standby mode of the reference voltage using device.

In this case, the fifteenth MOS transistor MPE1 of the start-up circuit 10B is turned on and the sixteenth and seventh MOS transistors MNE1 and MNE2 are turned off. Therefore, a current flow path between the eleventh and thirteenth MOS transistors MP8 and MP9 and a current flow path between the tenth MOS transistor MN3 and the reference potential are disconnected and the eighth MOS transistor MP6 fails to operate. Therefore, the start-up circuit 10B stops a normal operation.

Yet, if the reference voltage Vref is not provided to the reference voltage using device via another device or the power-down or standby mode of the reference voltage using device is terminated, an enable signal at a logic level 'high' is provided to the start-up circuit 10B shown in FIG. 8. Under these circumstances, the fifteenth MOS transistor MPE1 of the start-up circuit 10B is turned off and the sixteenth and seventh MOS transistors MNE1 and MNE2 are turned on. As a result, a current flow path between the eleventh and thirteenth MOS transistors MP8 and MP9 and a current flow path between the tenth MOS transistor MN3 and the reference potential are established. Therefore, the start-up circuit 10B performs a normal operation. Thus, the start-up circuit 10B shown in FIG. 8 may operate in response to the enable signal EN, thereby reducing excessive current consumption.

The above explained start-up circuit 10A/10B according to embodiments is non-limited by the circuit configuration of the example reference voltage generating unit 60 shown in FIG. 1 or the example circuit configuration of the bias voltage generating unit 40 shown in FIG. 3 and FIG. 4. In particular, even if the reference voltage generating unit 60 is configured different from the configuration shown in FIG. 1 and the bias voltage generating unit 40 is configured different from the configuration shown in FIG. 3 or FIG. 4, the aforesaid principle of the start-up circuit 10A/10B can also be applied.

Figure 9:
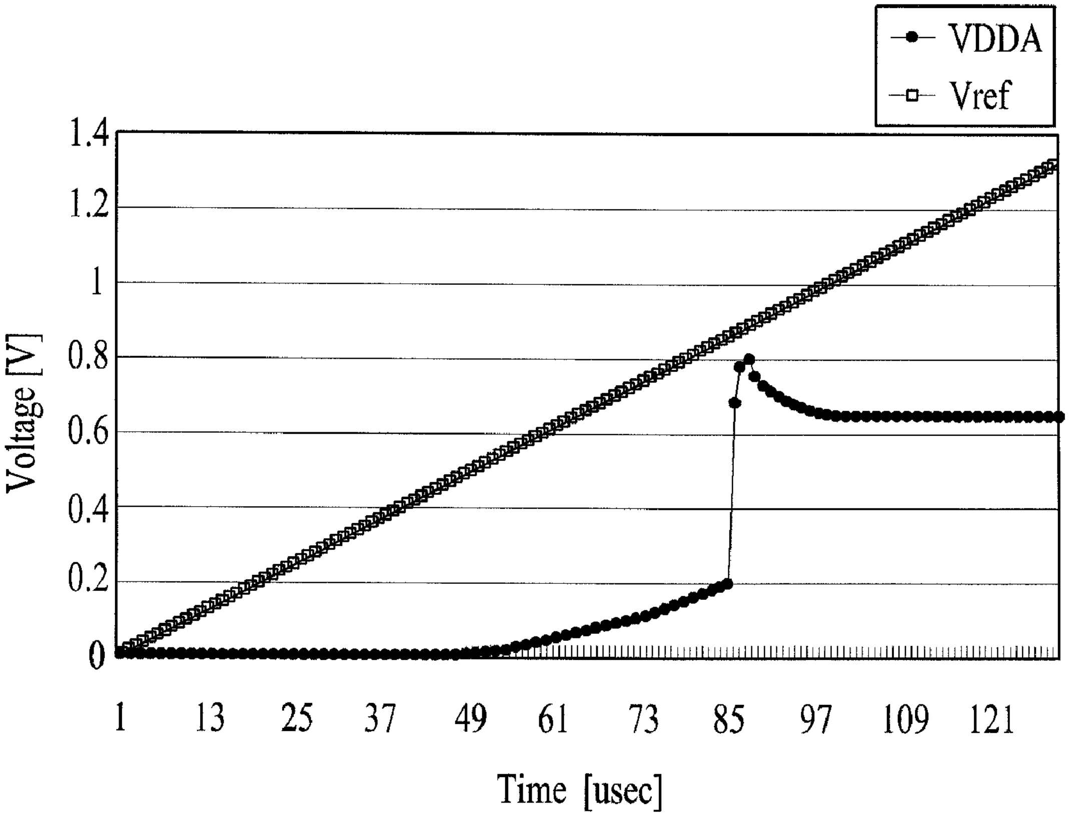
FIG. 9 is a graph for performance of a reference voltage generating circuit in a power-up state according to embodiments.

FIG. 9 is a graph for performance of a reference voltage generating circuit in a power-up state according to embodiments, in which horizontal and vertical axes indicate time and voltage, respectively. Referring to FIG. 9, in a power-up state in which a first supply voltage VDDA abruptly increases, it can be observed that a reference voltage Vref does not change but is stably generated.

Figure 10:
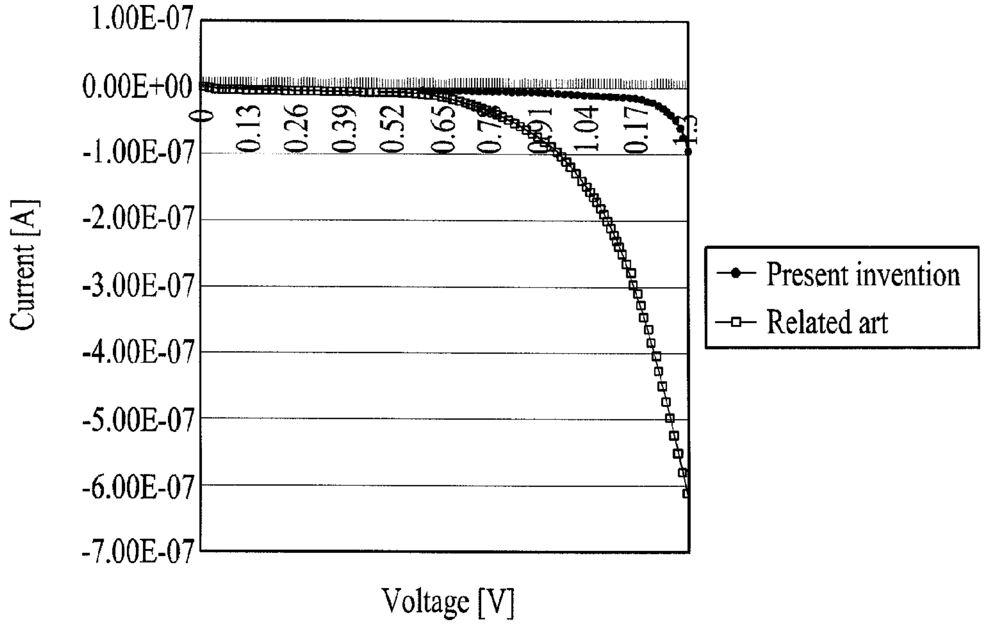
FIG. 10 is a graph for current consumptions of reference voltage generating circuits according to related circuits and present embodiments, respectively.

FIG. 10 is a graph for current consumptions of reference voltage generating circuits according to a related device and according to present embodiments, respectively, in which horizontal and vertical axes indicate voltage and consumed current, respectively. Referring to FIG. 10, it can be observed that a reference voltage generating unit according to embodiments minimizes its current power consumption as compared to that of a related BGR.

It will be obvious and apparent to those skilled in the art that various modifications and variations can be made in the embodiments disclosed. Thus, it is intended that the disclosed embodiments cover the obvious and apparent modifications and variations, provided that they are within the scope of the appended claims and their equivalents.

What is claimed is:

1. A device comprising:

a reference voltage generating unit configured to generate a uniform reference voltage in response to a bias voltage;

a bias voltage generating unit configured to generate the bias voltage; and a start-up circuit, after activating the bias voltage generating unit by receiving a first supply voltage, configured to cancel a change of the first supply voltage to maintain a separation from the bias voltage generating unit, wherein the bias voltage generating unit comprises:

a $4^{th}$ MOS transistor having a source and drain connected to the first supply voltage and the bias voltage, respectively;

a $5^{th}$ MOS transistor having a gate connected to the gate of the $4^{th}$ MOS transistor and a source connected to the first supply voltage;

a $6^{th}$ MOS transistor having a drain and source connected to the bias voltage and the reference potential, respectively;

a $4^{th}$ resistor having one side connected to the reference potential; and a $7^{th}$ MOS transistor having a gate connected to the gate of the $6^{th}$ MOS transistor, a drain connected to the drain of the $5^{th}$ MOS transistor and a source connected to the other side of the $4^{th}$ resistor.

2. The device of claim 1, wherein the reference voltage generating unit comprises:

a differential amplifier receiving a first node voltage and a second node voltage;

a $1^{st}$ MOS transistor having a gate connected to an output of the differential amplifier, a source connected to a second supply voltage and a drain connected to the first node voltage;

a $2^{nd}$ MOS transistor having a gate connected to the output of the differential amplifier, a source connected to the second supply voltage and a drain connected to the second node voltage;

a $3^{rd}$ MOS transistor having a gate connected to the output of the differential amplifier, a source connected to the second supply voltage and a drain connected to the reference voltage;

a $1^{st}$ bipolar transistor having an emitter and collector connected between the first node voltage and a reference potential and a base connected to the reference potential;

a $1^{st}$ resistor connected between the first node voltage and the reference potential;

a $2^{nd}$ resistor having one side connected to the second node voltage;

a $2^{nd}$ bipolar transistor having an emitter connected to the other side of the $2^{nd}$ resistor, a collector connected to the reference potential and a base connected to the reference potential;

a $3^{rd}$ resistor connected between the second node voltage and the reference potential; and an output resistor connected between the reference voltage and the reference potential.

3. A device comprising:

a reference voltage generating unit configured to generate a uniform reference voltage in response to a bias voltage;

a bias voltage generating unit configured to generate the bias voltage; and a start-up circuit operating in response to an enable signal, the start-up circuit, after activating the bias voltage generating unit by receiving a first supply voltage, configured to cancel a change of the first supply voltage to maintain a separation from the bias voltage generating unit, the bias voltage generating unit comprises:

a $4^{th}$ MOS transistor having a source and drain connected to the first supply voltage and the bias voltage, respectively;

a $5^{th}$ MOS transistor having a gate connected to the gate of the $4^{th}$ MOS transistor and a source connected to the first supply voltage;

a $6^{th}$ MOS transistor having drain and source connected to the bias voltage and the reference potential, respectively;

a $4^{th}$ resistor having one side connected to the reference potential; and a $7^{th}$ MOS transistor having a gate connected to the gate of the $6^{th}$ MOS transistor, a drain connected to the drain of the $5^{th}$ MOS transistor and a source connected to the other side of the $4^{th}$ resistor.

4. The device of claim 3, wherein the reference voltage generating unit comprises:

a differential amplifier receiving a first node voltage and a second node voltage;

a $1^{st}$ MOS transistor having a gate connected to an output of the differential amplifier, a source connected to a second supply voltage and a drain connected to the first node voltage;

a $2^{nd}$ MOS transistor having a gate connected to the output of the differential amplifier, a source connected to the second supply voltage and a drain connected to the second node voltage;

a $3^{rd}$ MOS transistor having a gate connected to the output of the differential amplifier, a source connected to the second supply voltage and a drain connected to the reference voltage;

a $1^{st}$ bipolar transistor having an emitter and collector connected between the first node voltage and a reference potential and a base connected to the reference potential;

a $1^{st}$ resistor connected between the first node voltage and the reference potential;

a $2^{nd}$ resistor having one side connected to the second node voltage;

a $2^{nd}$ bipolar transistor having an emitter connected to the other side of the $2^{nd}$ resistor, a collector connected to the reference potential and a base connected to the reference potential;

a $3^{rd}$ resistor connected between the second node voltage and the reference potential; and an output resistor connected between the reference voltage and the reference potential.

5. The device of claim 3, wherein the start-up circuit comprises:

an $8^{th}$ MOS transistor having a source and drain connected to the first supply voltage and the bias voltage, respectively;

a $9^{th}$ MOS transistor having a gate connected to the gate of the $8^{th}$ MOS transistor and a source connected to the first supply voltage;

a $10^{th}$ MOS transistor having a drain connected to a drain of the $9^{th}$ MOS transistor and a source connected to the reference potential;

an $11^{th}$ MOS transistor having a source connected to the first supply voltage and a gate and drain connected to each other;

a $12^{th}$ MOS transistor having a gate connected to the first supply voltage and a source connected to the reference potential; and a voltage distributing unit connected between the drain of the $11^{th}$ MOS transistor and a drain of the $12^{th}$ MOS transistor, the voltage distributing unit supplying a gate of the $10^{th}$ MOS transistor with a uniform control voltage for canceling a change of the first supply voltage.

6. The device of claim 5, wherein the voltage distributing unit comprises:

a $13^{th}$ MOS transistor having a source connected to the drain of the $11^{th}$ MOS transistor and a drain connected to the control voltage; and a 14$^{th}$ MOS transistor having a drain connected to the control voltage, a source connected to the drain of the 12$^{th}$ MOS transistor and a gate connected to a gate of the 13$^{th}$ MOS transistor.

7. The device of claim 5, wherein the voltage distributing unit comprises:

at least a fifth resistor and a sixth resistor connected in serial between the drain of the 11$^{th}$ MOS transistor and the drain of the 12$^{th}$ MOS transistor, wherein the control voltage is generated from a connected portion of the fifth resistors and sixth resistor.

8. The device of claim 5, the wherein voltage distributing unit comprises:

at least two capacitors connected in serial between the drain of the 11$^{th}$ MOS transistor and the drain of the 12$^{th}$ MOS transistor, wherein the control voltage is generated from a connected portion of the capacitors.

9. The device of claim 5, wherein the voltage distributing unit comprises:

a 3$^{rd}$ bipolar transistor having a collector connected to the drain of the 11$^{th}$ MOS transistor and an emitter connected to the control voltage; and a 4$^{th}$ bipolar transistor having a collector connected to the control voltage, an emitter connected to the drain of the 12$^{th}$ MOS transistor and a base connected to the base and emitter of the 3$^{rd}$ bipolar transistor.

10. The device of claim 5, the voltage distributing unit comprising:

a 1$^{st}$ diode having an anode connected to the drain of the 11$^{th}$ MOS transistor and a cathode connected to the control voltage; and a 2$^{nd}$ diode having an anode connected to the control voltage and a cathode connected to the drain of the 12$^{th}$ MOS transistor.

11. The device of claim 6, wherein the start-up circuit comprises:

a 15$^{th}$ MOS transistor having a source and drain respectively connected to the source and drain of the 8$^{th}$ MOS transistor and a gate connected to the enable signal;

a 17$^{th}$ MOS transistor having a drain connected to the drain of the 11$^{th}$ MOS transistor, a source connected to the voltage distributing unit and a gate connected to the enable signal; and a 16$^{th}$ MOS transistor having a drain connected to the source of the 10$^{th}$ MOS transistor, a source connected to the reference potential and a gate connected to the enable signal.

12. The device of claim 3, wherein the enable signal is generated when the uniform reference voltage is externally supplied instead of being generated from the reference voltage generating unit and wherein the enable signal is provided to the start-up circuit.

13. The device of claim 3, wherein the enable signal is generated in a power-down mode.

14. The device of claim 3, wherein the enable signal is generated in a standby mode.

15. A method comprising:

generating, from a reference voltage generating unit, a uniform reference voltage in response to a bias voltage;

generating, from a bias voltage generating unit, the bias voltage; and in response to an enable signal, activating the bias voltage generating unit by receiving a first supply voltage, and canceling a change of the first supply voltage to maintain a separation from the bias voltage generating unit, wherein the enable signal is generated in a power-down mode.

16. The method of claim 15, wherein the enable signal is generated in a standby mode.

17. The method of claim 15, wherein the enable signal is generated when the uniform reference voltage is externally supplied instead of being generated from the reference voltage generating unit.

* * * * *